(12) United States Patent
Verweij et al.

(10) Patent No.: US 7,518,705 B2
(45) Date of Patent: Apr. 14, 2009

(54) LITHOGRAPHIC APPARATUS AND DEVICE MANUFACTURING METHOD

(75) Inventors: Antonie Hendrik Verweij, Dussen (NL); Edwin Johan Buis, Belfeld (NL); Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 238 days.

(21) Appl. No.: 11/520,779

(22) Filed: Sep. 14, 2006

(65) Prior Publication Data

US 2008/0070353 A1    Mar. 20, 2008

(51) Int. Cl.
    *G03B 27/54* (2006.01)
(52) U.S. Cl. .............................. 355/67; 355/71; 378/34
(58) Field of Classification Search ............... 355/53, 355/67, 71; 378/34, 35
    See application file for complete search history.

(56) References Cited

U.S. PATENT DOCUMENTS

| | | | | |
|---|---|---|---|---|
| 4,820,899 A | * | 4/1989 | Hikima et al. ......... | 219/121.76 |
| 6,762,823 B2 | * | 7/2004 | Suzuki ................... | 355/52 |
| 7,190,434 B2 | * | 3/2007 | Gui et al. ............... | 355/67 |
| 2002/0115004 A1 | * | 8/2002 | McCullough et al. ... | 430/22 |
| 2005/0012913 A1 | * | 1/2005 | Verweij et al. ......... | 355/53 |
| 2005/0200830 A1 | | 9/2005 | Carter et al. | |
| 2007/0153247 A1 | * | 7/2007 | Nagasaka ............... | 355/53 |
| 2007/0273854 A1 | * | 11/2007 | Nagasaka ............... | 355/46 |

* cited by examiner

*Primary Examiner*—Della Rutledge
(74) *Attorney, Agent, or Firm*—Sterne, Kessler, Goldstein & Fox P.L.L.C.

(57) ABSTRACT

The present invention relates to a lithographic apparatus including an illumination system configured to condition a radiation beam; a support constructed to support a first and a second patterning device, each patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the illumination system includes a radiation beam path adaptation device, wherein the adaptation device is configured to adapt a radiation beam path to allow subsequent projections of a pattern of the first patterning device and a pattern of the second patterning device during a single scanning movement of the patterning device support.

21 Claims, 6 Drawing Sheets

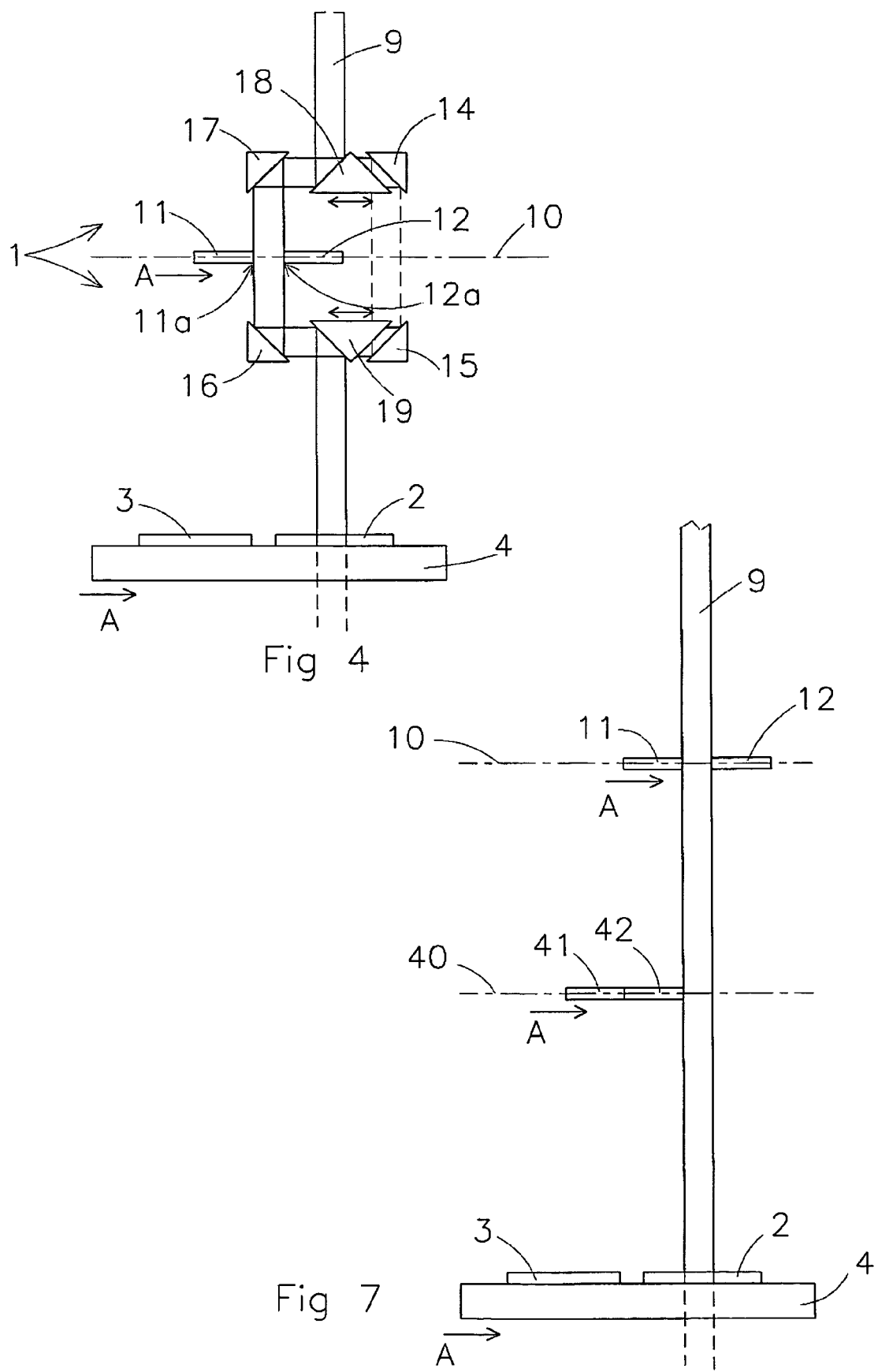

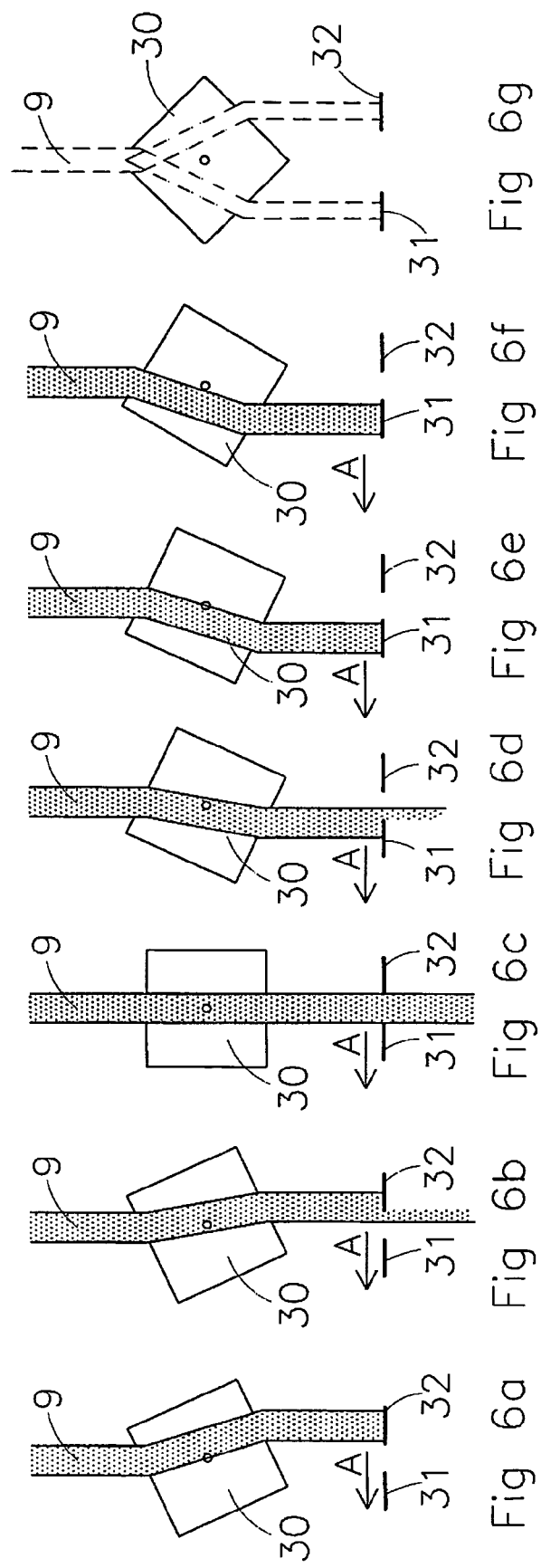

LITHOGRAPHIC APPARATUS AND DEVICE MANUFACTURING METHOD

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known scanner type lithographic apparatus, a reticle masking device is used to block any light which would be projected outside the actual pattern to be projected. Such reticle masking device may have the following benefits. The reticle masking device (1) removes the need for having a wide (i.e., expensive) light blocking border area, for instance of chrome, (2) blocks light that might otherwise leak through pin holes in the border area, (3) allows a selected portion of the full patterned area to be exposed, and (4) selectively blocks reticle alignment targets so that they are not printed on the wafer.

Generally, the reticle masking device of the known lithographic apparatus includes four independently movable REMA blades configured as two pairs. One pair of REMA blades has edges that are aligned parallel to the exposure scan axis. This first pair remains normally stationary during the exposure scan and delimits the width of the exposed field. A second pair of REMA blades has edges that are aligned orthogonal to the scan axis. This second pair moves synchronously with the reticle and delimits the dimension of the radiation beam which is to be projected on a patterning device and thus of the length of the exposed field. An example of the known reticle masking device is for instance disclosed in US 2005/0200830A1, the contents of which are herein incorporated by reference.

In the known lithographic apparatus, it is desirable to locate the REMA blades at a focus plane of the illumination system, i.e. an image plane conjugate to the patterning device, rather than near the patterning device itself. Because of a minimum distance between the patterning device, located in a focal plane, and the reticle masking device, the masking blades produce a relatively large half-shadow, resulting in a requirement for a large chrome border around the pattern on the reticle. Note that the blades are never imaged on the wafer. To further increase the throughput of a lithographic apparatus it has been proposed to place two patterning devices in a single patterning device support so that the patterns of each of the first and the second patterning device may be projected on the substrate in a single scanning movement. When in such method use is made of a reticle masking device to obtain the above described advantages for such device, the reticle masking device will be moved in the scanning direction through the radiation beam to provide a 'scanning' radiation beam. At the end of the scanning of the pattern of the first patterning device, the reticle masking device will have to be moved from one side of the radiation beam to the original position of the reticle masking device at the other side of the radiation beam, before the required scanning movement of the reticle masking device can be made for the second patterning device.

Since it is undesired to change the speed with which the patterning device support is moved and the distance between the first and the second patterning device is relatively short, there is only a very small time available to move the reticle masking device back to the original position.

A drawback of the present known lithographic apparatus is that in most cases the available time will not be sufficient to move the reticle masking device back to the original position to start a new scanning movement.

SUMMARY

It is desirable to provide a lithographic apparatus being configured to expose, in a single continuous scanning movement, the patterns of a first and a second patterning device being carried by a single patterning device support on a substrate.

According to an embodiment of the invention, there is provided a lithographic apparatus including an illumination system configured to condition a radiation beam; a support constructed to support a first and a second patterning device, each patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the illumination system includes a radiation beam path adaptation device, wherein the adaptation device is configured to adapt a radiation beam path to allow subsequent projections of a pattern of the first patterning device and a pattern of the second patterning device during a single scanning movement of the patterning device support.

According to an embodiment of the invention, there is provided a lithographic apparatus including an illumination system configured to condition a radiation beam; a support constructed to support a first and a second patterning device, each patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the illumination system includes a first reticle masking device configured to at least in a scanning direction delimit a beam dimension of the radiation beam, wherein the first reticle masking device is arranged in a first focus plane of the illumination system and wherein the first reticle masking device is movable in the first focus plane in a scanning direction, and a second reticle masking device configured to at least in a scanning direction delimit a beam dimension of the radiation beam, wherein the second reticle masking device is arranged in a second focus plane of the illumination system and wherein the second reticle masking device is movable in the second focus plane in the scanning direction.

According to an embodiment of the invention, there is provided a device manufacturing method including transferring subsequently a pattern from a first patterning device and a pattern from a second patterning device onto a substrate, wherein the first and the second patterning device are carried by a single patterning device support, which is moved in a scanning direction, wherein the method includes adapting an optical path of the radiation beam in order to subsequently provide a scanning radiation beam for the first patterning device and the second patterning device during a single scanning movement of the patterning device support.

According to an embodiment of the invention, there is provided a device manufacturing method including transferring subsequently a pattern from a first patterning device and a pattern from a second patterning device onto a substrate, wherein the first and the second patterning device are carried by a single patterning device support, which is moved in a scanning direction, the method including moving a first reticle masking device in a first focus plane of the illumination system to provide a first scanning radiation beam for the first patterning device, and subsequently moving a second reticle masking device in a second focus plane of the illumination system to provide a second scanning radiation beam for the second patterning device.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a radiation beam adaptation device according to an embodiment of the invention in a first position;

FIG. 6 depicts a radiation beam adaptation device according to an embodiment of the invention; and FIG. 7 depicts an illumination system according to an embodiment of the invention.

DETAILED DESCRIPTION

Figure 1:
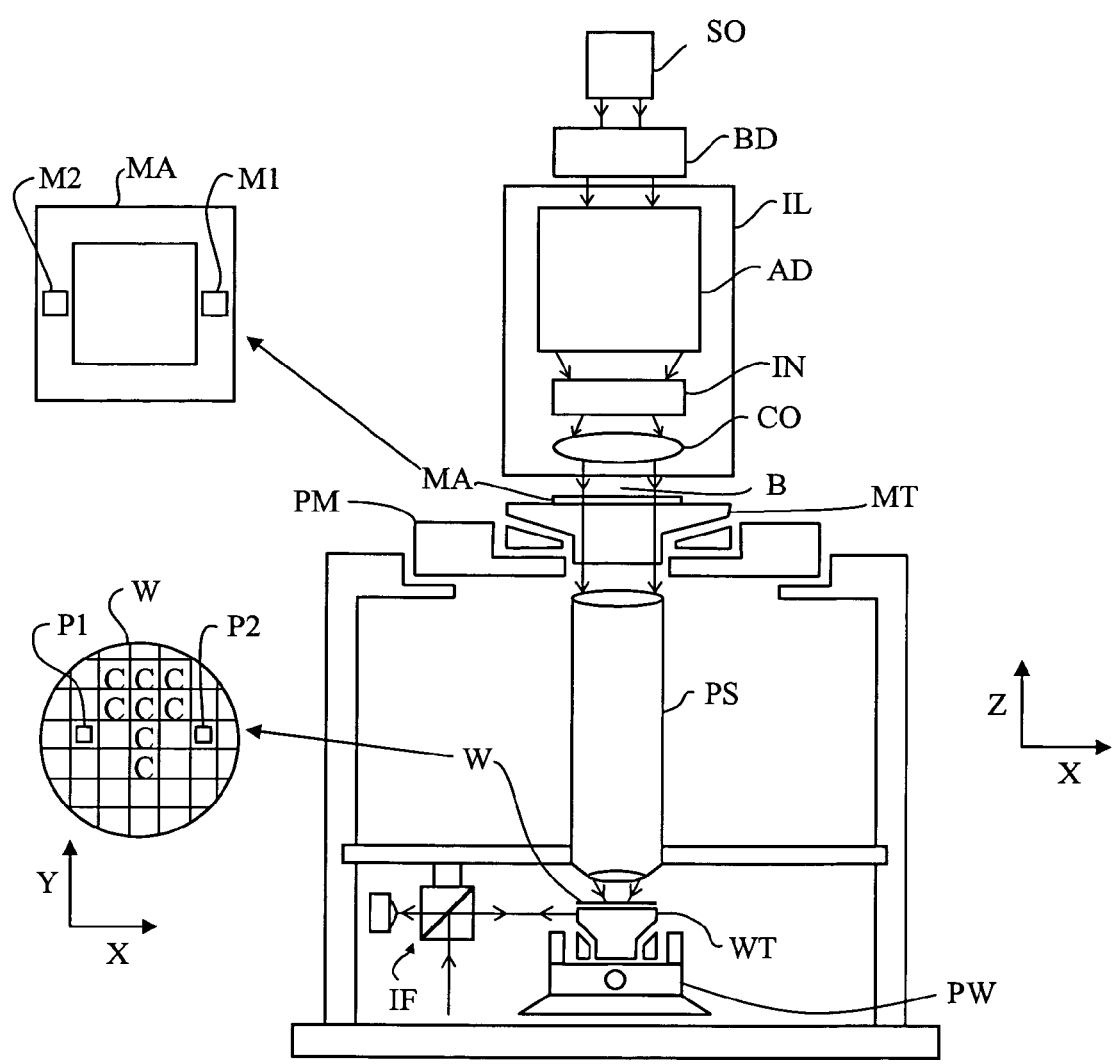
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
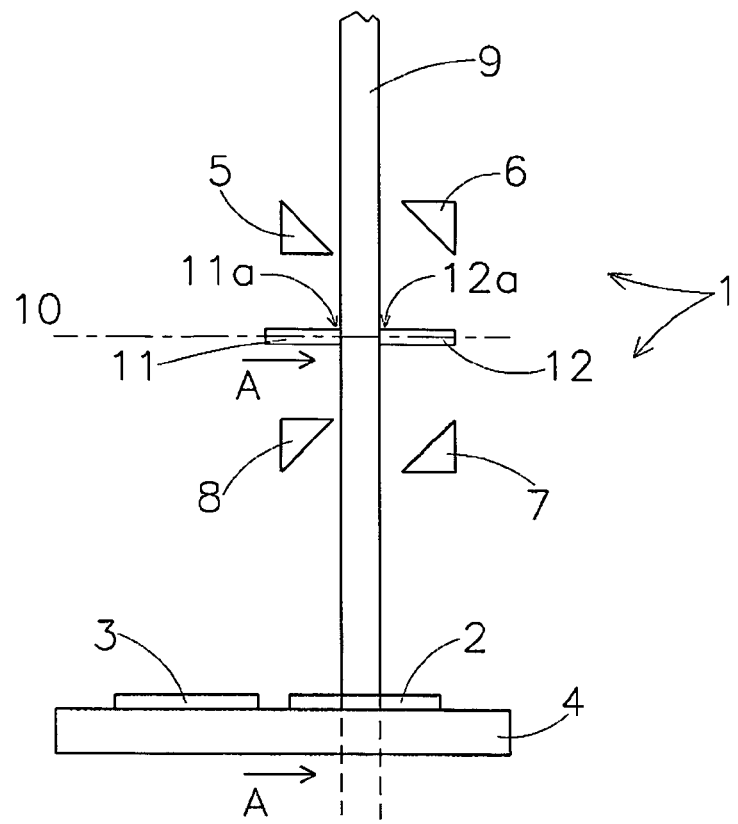
FIG. 2a depicts a radiation beam adaptation device according to an embodiment of the invention in a first position.

FIG. 2a shows a radiation beam path adaptation device according to an embodiment the invention, generally indicated with the reference numeral 1. The adaptation device 1 is configured to adapt a radiation beam path of a lithographic apparatus in order to make subsequent exposure of a pattern of a first patterning device 2 and a second patterning device 3 possible during a single scanning movement of a patterning device support 4 carrying both the first patterning device 2 and the second patterning device 3.

The adaptation device 1 includes a redirection device having a number of deflection mirrors 5, 6, 7, 8 which can be used to redirect the optical path of a radiation beam 9. The redirection device can be placed in two positions. In the first position which is shown in FIG. 2a the deflection mirrors 5, 6, 7, 8 are placed outside the optical path of the radiation beam 9 so that the radiation beam 9 is not redirected. As a consequence the radiation beam 9 crosses a focus plane 10 of the illumination system at a first location.

In the focus plane 10 a reticle or patterning device masking device is arranged of which masking blades 11 and 12 are shown in FIG. 2a. The masking blades 11 and 12 are used to block light of the radiation beam which would fall outside the pattern to be exposed on a substrate. Such reticle or patterning device masking device is in general known and for instance described in US 2005/0200830A1, the contents of which are herein incorporated by reference. The masking blades have edges 11a and 12a which are orthogonal with respect to the scanning direction A. The reticle masking device normally includes another pair of masking blades (not shown) of which the edges run parallel to the scanning direction shown. This second pair of masking blades is normally adjusted for the width of the pattern to be projected. During the scanning movement of the patterning device support 4 and the corresponding substrate support the masking blades 11, 12 will be moved to block off any light of the radiation beam which would not be projected on a pattern of the patterning device. In practice, this normally means that the edges 11a and 12a of the masking blades 11, 12 will lie against each other and be positioned at the (in the drawing) left side of the radiation beam at the beginning of the scanning movement of the first patterning device 2.

When the front end of pattern of the first patterning device 2 comes in line with the left side of the radiation beam 9, the masking blade 12 will start moving with the first patterning device 2 in the scanning direction. Due to the movement of the masking blade 12 a projection slit will come into existence between the edges 11a and 12a resulting in a radiation beam 9 to be projected on the first patterning device 2 to project the pattern of the first patterning device 2 on the substrate being supported by a substrate support.

In FIG. 2a, the projection of the first patterning device 2 is halfway, whereby the projection slit between the edges 11a and 12a is maximally opened. When the trailing end of the first patterning device 2 reaches the left side of the radiation beam 9, the masking blade 11 will start moving towards the masking blade 12 so that the edge 11a stays in line with the trailing end of the pattern of the first patterning device 2. When the trailing end of the first patterning device 2 reaches the right side of the radiation beam, the edges 11a and 12a of the masking blades 11 and 12 will again lie against each other but now at the right side of the radiation beam 9. Note that because the blades require a certain distance to come to a stop after scanning through radiation beam 9, the location of the edges of the masking blades after stopping may be located further away to the right side of radiation beam 9. Similarly, before starting the projection process, the blades may be located further away from radiation beam 9 at the left side. Starting and stopping the motion of the blades is done such that during the time a blade edge defines the projection beam incident to a patterning device, the motion is in synchronism with the patterning support.

After the pattern of the first patterning device 2 has been projected on the substrate, the patterning device support 4 will continue to move in the scanning direction A for the projection of the pattern of the second patterning device 3. Since there is a certain space between the trailing end of the first patterning device 2 and the front end of the second patterning device 3 there is time available to make a subsequent projection possible. However, the available time is in general too short to move the masking blades 11, 12 back to the original position wherein the edges lie at the left side of the radiation beam 9.

Figure 2B:
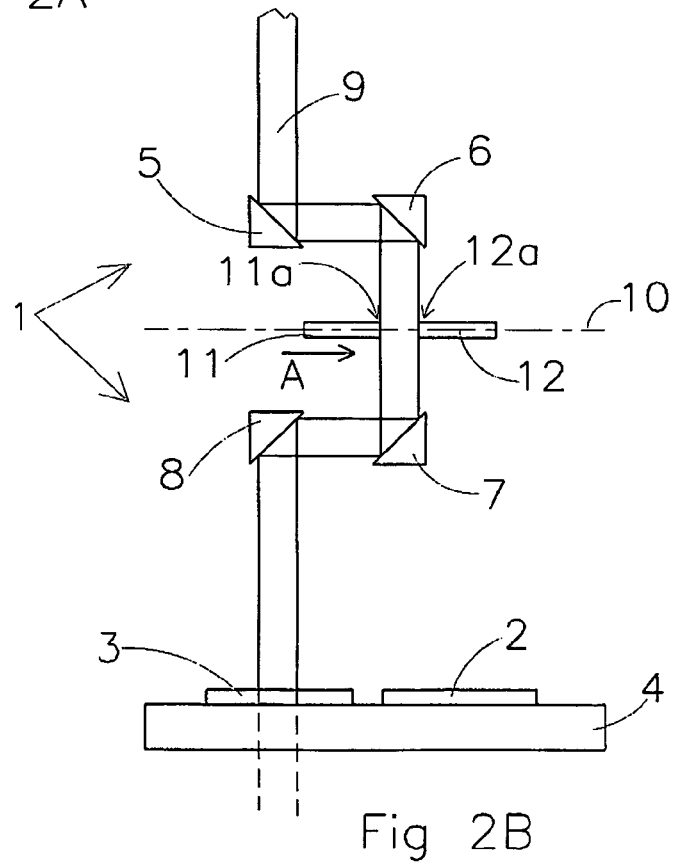
FIG. 2b depicts the adaptation device of FIG. 2a in a second position.

To make subsequent projection of the pattern of the second patterning device 3 possible, the redirection device is moved in a second position which is shown in FIG. 2b. In the second position of the redirection device the mirrors 5 and 8 are placed in the first optical path of the radiation beam 9. As a result the radiation beam 9 will follow a different optical path, i.e. the second optical path, which crosses the focus plane 10 at a location which is spaced in the scanning direction from the location where the first optical path crosses the focus plane 10. Note that during the time of moving the redirection device, the light source may be switched off.

In the time wherein the patterning device support 4 is moved in the scanning direction until the front end of pattern of the second patterning device reaches the left side of the radiation beam, the masking blades 11, 12 of the reticle or patterning device masking device may also be moved in the scanning direction to reach the left side of the radiation beam 9 in the location where the second optical path crosses the focus plane 10. When the edges 11a and 12a of the reticle or patterning device masking device and the front end of the second patterning device 3 both are located at the left side of the radiation beam, a scanning projection of the second patterning device 3 can be carried out. Such scanning projection is in principle the same as the projection of the pattern of the first patterning device 2.

In FIG. 2b, the projection of the pattern of the second patterning device 3 is shown halfway the projection of the pattern of the second patterning device 3. When the pattern of the second patterning device 3 is fully completed, the edges 11a and 12a will be located at the right side of the radiation beam 9. The projection of the pattern of the first and second patterning devices 2 and 3 may then be continued in reverse order, wherein first the pattern of the second patterning device 3 is projected while the radiation beam is directed along the second optical path as shown in FIG. 2b, and, consequently, the redirection device may be placed in the first position so that the radiation beam 9 will follow the first optical path as shown in FIG. 2a. The resulting radiation beam 9 can again be used for the projection of the pattern of the first patterning device 2.

In an embodiment, the distance between the mirrors 5 and 6 and 7 and 8 may be adjustable, so that for a given speed of the reticle masking device, the time needed to move the reticle or patterning device masking device from the first crossing location to the second crossing location may be adjusted by adjusting the distance between the mirrors 5 and 6 and 7 and 8, respectively, to correspond with the time available, i.e. the time between the trailing end of the pattern of the first patterning device 2 leaving the radiation beam 9 and the front end of the pattern of the second patterning device 3 entering the radiation beam 9.

In a preferred embodiment, the patterning device support 4 and the reticle or patterning device masking device move with the same speed and, as a consequence, the distance between the mirrors 5 and 6 and 7 and 8 respectively is preferably the same as the distance between the trailing end of the pattern of the first patterning device 2 and the front end of the pattern of the second patterning device 3.

Figure 3A:
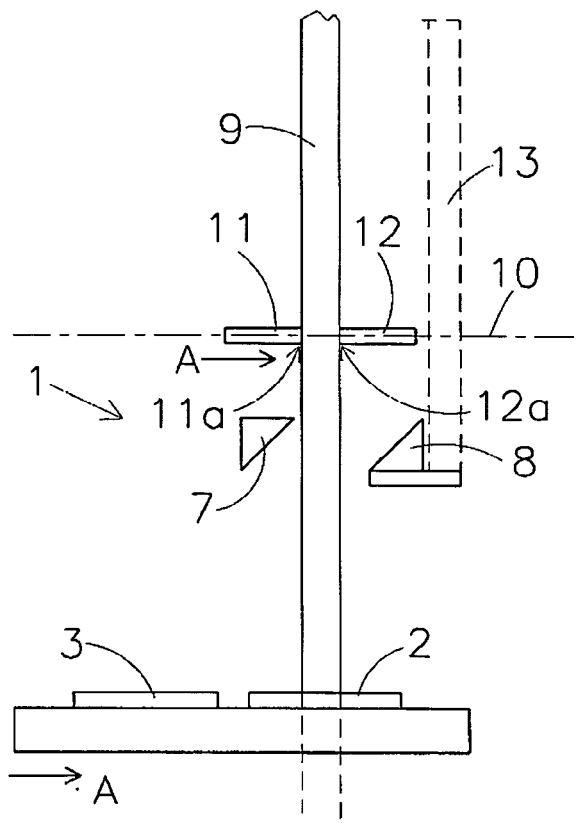
FIG. 3a depicts a radiation beam adaptation device according to an embodiment of the invention in a first position.
Figure 3B:
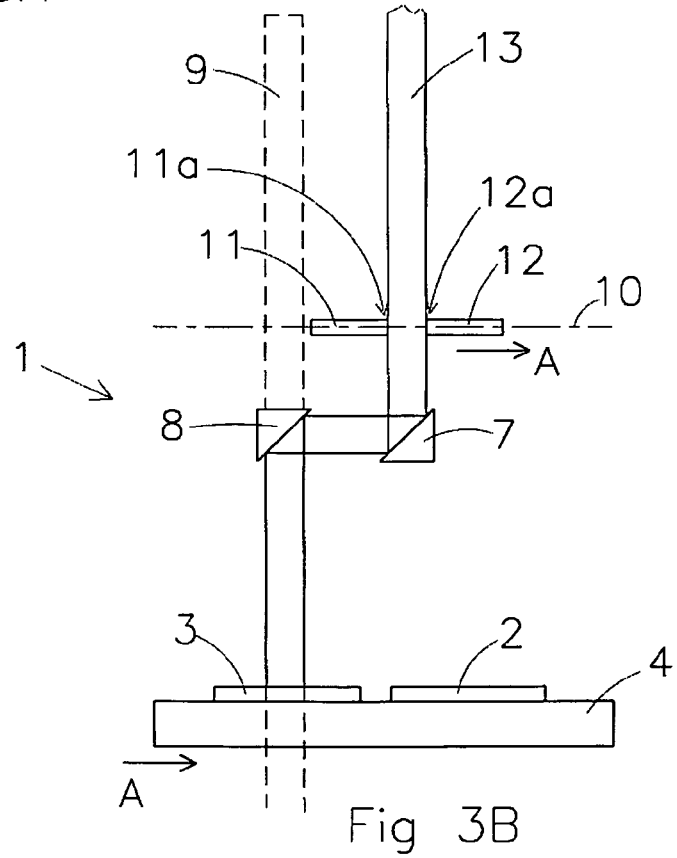
FIG. 3b depicts the adaptation device of FIG. 3a in a second position.

FIGS. 3a and 3b show a radiation beam path adaptation device according to an embodiment of the invention to be used for the subsequent projection of a pattern of a first patterning device 2 and a pattern of a second patterning device 3 which are carried by a single patterning device support 4. In the embodiment of FIGS. 3a and 3b the illumination system is configured to continuously or alternately provide a first radiation beam 9 and a second radiation beam 13. The first radiation beam 9 crosses a focus plane 10 of the illumination system at a first crossing location and the second radiation beam 13 crosses the focus plane 10 at a second crossing location which is spaced apart from the first crossing location in the scanning direction A.

The embodiment of FIGS. 3a and 3b further includes a redirection device 1 having mirrors 7 and 8. This redirection device 1 can be moved between two positions. In FIG. 3a the mirrors 7 and 8 are placed in the first position in which the mirrors 7 and 8 do not obstruct the optical path of the radiation beam. As a consequence, the radiation beam 9 can be used for the projection of a pattern of the first patterning device 2 on a substrate as shown in FIG. 3a. A reticle or patterning device masking device having masking blades 11 and 12 is provided to block off the radiation beam for any part of the patterning device 2 which does not have to be projected on the substrate. The functioning of the reticle or patterning device masking device corresponds to the reticle or patterning device masking device described in relation to FIGS. 2a and 2b.

In FIG. 3a, the lithographic apparatus is shown during the projection of a pattern of a first patterning device on a substrate. When the projection of a pattern of the first patterning device has finished, the masking blades cannot be moved back in time to be used for the projection of the pattern of the second patterning device 3. For this reason the second radiation beam 13 is provided. The reticle masking device may be moved in the scanning direction A to the second crossing location where it may be used to block off, when needed, the second radiation beam during the projection of the pattern of the second patterning device on the substrate. To make projection of the second radiation beam 13 on the second patterning device 3 possible the redirection device 2 is moved into the second position so that the second radiation beam 13 is redirected via the mirrors 7 and 8 to partially coincide with the optical path of the first radiation beam 9. In this way, the location of the radiation beam 9, 13 which at that moment is used to project a pattern of the first or second patterning device will be positioned at the same location with respect to the moving patterning device support 4. Note that mirror 8 may be fixed in the same location, if radiation beams 10 and 13 are switched on and off depending on the patterning device to be used.

FIG. 4 shows a radiation beam path adaptation device according to an embodiment of the invention. In principle, this embodiment corresponds to the first embodiment shown in FIGS. 2a and 2b with the exception that the redirection device is configured such that the optical path of the radiation beam 9 has a substantially equal length to the main plane of the first and second patterning devices 2, 3 in both the first and the second position of the redirection device 1.

The redirection device 1 includes six mirrors 14, 15, 16, 17, 18 and 19. The mirrors 14, 15, 16 and 17 are arranged stationary while the mirrors 18 and 19 are movable between a first position (as shown in FIG. 4) to direct the radiation beam 9 along a first optical path at the left side of the drawing and a second position to direct the radiation beam 9 along a second optical path at the right side of the drawing. The first optical path crosses the focus plane 10 at a first crossing location and the second optical path crosses the focus plane 10 at a second crossing location, which is spaced in the scanning direction from the first crossing location.

In FIG. 4, the lithographic apparatus is shown during the projection of a pattern of the first patterning device 2. By moving (in FIG. 4) the mirrors 18, 19 to the left to the second position of the redirection device 1, the radiation beam will be directed along the second optical path making subsequent projection of a pattern of the second patterning device possible, while keeping the same optical path length. In addition to a translating mirror, also rotating mirrors are possible.

Figure 5A:
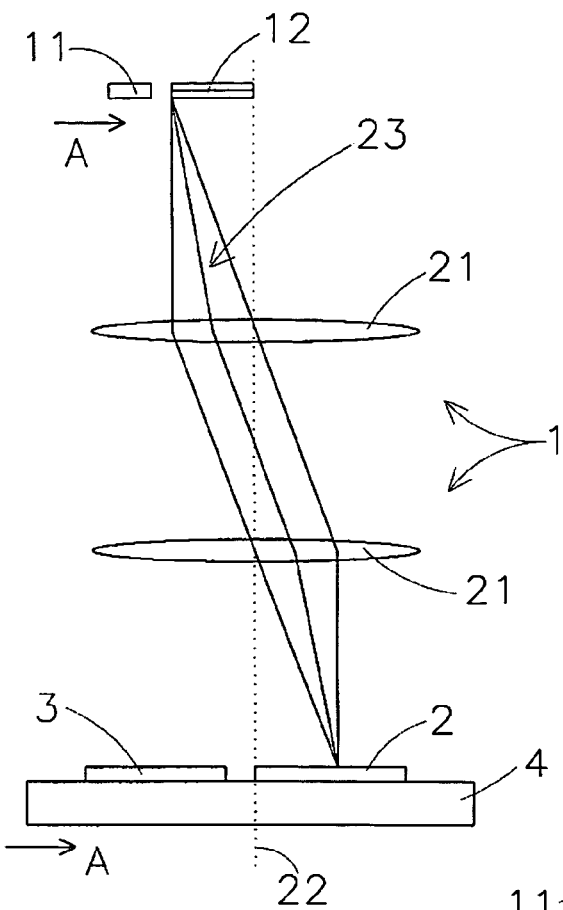
FIG. 5a depicts a radiation beam adaptation device according to an embodiment of the invention in a first position.
Figure 5B:
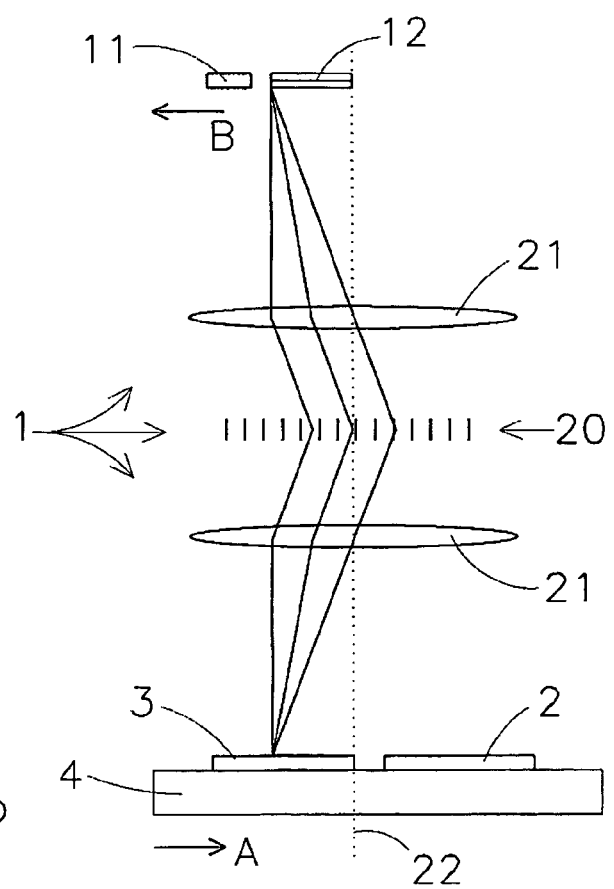
FIG. 5b depicts the adaptation device of FIG. 5a in a second position.

FIGS. 5a and 5b show another embodiment of the invention wherein a redirection device 1 is provided to make a subsequent projection of patterns of a first patterning device 2 and a second patterning device 3 carried on the patterning device support 4 possible during a single continuous scanning movement of a patterning device support 4. The redirection device 1 of the embodiment of FIGS. 5a and 5b includes a multi-mirror device 20 (see FIG. 5b) and lenses 21.

In FIG. 5a, the redirection device 1, in particular the multi-mirror device 20 (not shown in FIG. 5a) is placed in a first position wherein it does not have any influence on the optical path of the radiation beam 23. The radiation beam 23 may be used to project a pattern of the first patterning device 2 as is shown in FIG. 5a. During the scanning movement of the patterning device support 4 the patterning device support 4 is moved in the scanning direction A, and the reticle or patterning device masking device having masking blades 11 and 12 is also moved in the scanning direction A when needed, i.e. when the patterning device 3 enters the radiation beam 23 and leaves the radiation beam 23.

When the projection of a pattern of the first patterning device 3 is finished the multi-mirror device 20 is placed into the second position as shown in FIG. 5b. In this second position of the multi-mirror device 20 it inverts the radiation beam 23 with respect to a main optical axis 22 of the illumination system. The inverted radiation beam 23 can beneficially be used for the projection of the pattern of the second patterning device 3 as will be explained hereinafter.

Since the radiation beam is inverted with respect to the main axis 23 of the illumination system, moving the masking blades 11, 12 of the reticle masking device in the scanning direction B, results in the same location of projection as when the reticle masking device is moved in the opposite scanning direction A without the inversion of the multi-mirror device 20. As after the projection of the pattern of the first patterning device 2 the masking blades 11, 12 will be located at the right side of the drawing, as was explained in relation with the embodiment of FIGS. 2a and 2b, the movement in the opposite scanning direction B can directly be started after placing the multi-mirror device in the second position without the need to first move the masking blades 11, 12 to another location.

In FIG. 5b, the lithographic apparatus is shown during the projection of the pattern of the second patterning device 3, while the radiation beam is inverted by the multi-mirror device 20.

The multi-mirror device 20 may for instance be a grid of mirrors being arranged parallel to the main axis 22, or be made of Quartz elements which are rotated between the first and second position of the multi-mirror device 20, or any other multi-mirror device of inverting the optical path of the radiation beam 23. In alternative embodiments, also any other device capable of inverting the radiation beam with respect to the main axis 23 may be used.

FIGS. 6a-6g show a redirection device according to an embodiment of the invention. The redirection device includes a cubic mirror 30 which is rotatably mounted about a pivot, which pivot lies in the radiation beam, when it is not redirected by the redirection device. The axis of the cubicle mirror is perpendicular to main axis of the non-redirected radiation beam 9. The redirection device further includes stationary masking blades 31, 32. Between the masking blades 31, 32 a projection slit is formed. The stationary masking blades 31, 32 may be adjustable to adjust the dimension of the projection slit between the masking blades 31, 32.

Due to the cubic form of the cubic mirror 30, the cubic mirror 30 will provide upon rotation a scanning radiation beam 9 which makes a scanning movement in the scanning direction A over the projection slit as can be seen from FIGS. 6a-6g. This scanning movement is synchronized with the passing by of a patterning device being carried on a patterning device support. In such case the front end of pattern of the patterning device should be lined out and move together with the front side of the scanning radiation beam, while the trailing end of a pattern of the patterning device should be lined out and move together with the trailing end of the scanning movement of the radiation beam 9.

When the projection of a pattern of a first patterning device on a patterning device support is finished the cubic mirror 30 can be rotated further so that the radiation beam comes on a next side of the cubic mirror 30 (FIG. 6g) so that the redirected radiation beam projected on the masking blades 31, 32 returns to the start position of FIG. 6a. Consequently the pattern of a second patterning device carried on a patterning device support may be projected on a substrate. By tuning the rotation speed of the cubic mirror 30 with respect to the speed of the scanning movement of the patterning device support and the distance between a pattern of a first and a second patterning device, subsequent projections of a pattern of a first patterning device and a second patterning device in a single preferable continuous scanning movement of the patterning device support can be made possible.

In the case the dimension of pattern of the patterning device in the scanning direction A is larger than the dimension of the projection slit between the stationary masking blades 31, 32 it may be desirable to stop the rotation of the cubic mirror 30 in the position shown in FIG. 6c until the trailing end of the patterning device comes in line with the right side of the projection slit. Then the rotation of the cubic mirror is started again so that the trailing end of the radiation beam follows the trailing end of the pattern of the patterning device being projected.

It is noted that the cubic mirror 30 may be exchanged for any other optical element or combination of optical elements which upon movement of one or more of the optical elements provides a scanning radiation beam over a projection slit formed between two stationary masking blades, such as for instance two polygon mirrors. All such embodiments are deemed to fall within the scope of the present invention.

Furthermore it is noted that the above described combination of a movable optical element or combination of optical elements providing a scanning radiation which can be moved over a stationary projection slot may also be used for the projection of a pattern of a single patterning device being carried by a patterning device support only capable of carrying one patterning device.

FIG. 7 shows an embodiment of a illumination system according to an embodiment of the invention. This embodiment is also capable of providing a radiation beam 9 for subsequent projection of a pattern of a first patterning device 2 and a second patterning device 3 which are both carried by a patterning device support 4 during a single continuous movement of the patterning device support 4.

In FIG. 7, the radiation beam 9 projects a pattern of a first patterning device 2 on a substrate (not shown). A reticle or patterning device masking device arranged in the focus plane 10 and having masking blades 11, 12 is provided to block off the radiation beam for any part of the patterning device 2 which does not have to be projected. The functioning of the masking blades 11, 12 is with respect to the projection of the pattern of the first patterning device support corresponding to the masking blades 11, 12 described in relation to FIGS. 2a and 2b. After the scanning movement of the masking blades for the projection of the pattern of the first patterning device 2, the masking blades 11, 12 are located at the (in the drawing) right side of the radiation beam 9 and may not be moved back in time to the original position at the left side of the radiation beam 9 to make subsequent projection of a pattern of the second patterning device 3 possible.

For this reason, a second reticle or patterning device masking device having a second pair of masking blades 41, 42 is provided in a second focus plane 40 of the illumination system, which second reticle or patterning device masking device may be used during the projection of the pattern of the second patterning device 3. As it is not required to wait for the first reticle or patterning device masking device to the original position, the subsequent projection of the pattern of the second patterning device 3 can be started when the masking blades 11, 12 of the first reticle masking device have been taken out of the radiation beam 9 and the masking blades 41, 42 are placed in the radiation beam 9 at the correct start position as explained in relation with FIGS. 2a and 2b. The second reticle masking device with masking blades 41, 42 functions corresponding to the first reticle or patterning device masking device having masking blades 11, 12.

In an embodiment of the present application, a patterning device support is described carrying both a first and a second patterning device. In an alternative embodiment the first patterning device may be carried by a first patterning device support and the second patterning device may be carried by a second patterning device support. During the single scanning movement the first and the second patterning device support may be moved in the scanning direction with corresponding speed, so that the distance between the first patterning device support and the second patterning device support remains constant. Such assembly of a first patterning device support and a second patterning device support carrying a first and second patterning device, respectively, which is moved with constant speed at a certain constant distance is regarded to be a single patterning device support carrying a first and second patterning device within the meaning of the present application.

Furthermore, in the above description a patterning device support carrying a first and a second patterning device is described. In alternative embodiments it is possible that three or more patterning devices are carried by a single patterning device support. Such embodiment may be used to subsequently project the pattern of the three or more patterning devices on a substrate during a single scanning movement. The radiation beam adaptation device may have to be configured to make such subsequent projection of patterns of three or more patterning devices possible.

For instance, it may be desirable to use in the embodiments of FIGS. 2a, 2b, 3a, 3b, 4a redirection device having three positions, each of the positions providing an optical path of the radiation beam at a different location in the focus plane wherein the reticle or patterning device masking device is arranged, the locations being spaced in the scanning direction. The embodiments of FIGS. 5 and 6 are already capable of dealing with three or more patterning devices in a single scanning movement. In the embodiment of FIG. 7, a third reticle or patterning device masking device may be provided in a third focus plane of the illumination system. It may also be possible to move during the scanning movement of the second reticle or patterning device masking device, the first reticle or patterning device masking device back to the original position without interfering the radiation beam. During the second scanning movement of the first reticle or patterning device masking device the second masking device may be brought back to the original position and so on. All such embodiments are regarded to fall within the scope of the present claims.

In the above application the term scanning direction is used to indicate the direction in which parts of the lithographic apparatus move during the projection of a pattern of a patterning device on a substrate. As a result of optical elements present between the different parts of the lithographic apparatus the scanning direction of different parts does not necessarily have to be the same. For instance, it may be possible that the reticle masking blades of the reticle or patterning device masking device are actually moved in a direction reverse to the direction in which the patterning device support is moved during scanning. In such case both directions are considered to be scanning directions for the respective parts.

It is also possible that the scanning directions lie at an angle of 90 degrees, for instance in the case where the radiation beam is deflected over an angle of 90 degrees between the two respective parts making a scanning movement. Any other angle between the scanning directions of different parts may also be possible.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
    an illumination system configured to condition a radiation beam;
    a support constructed to support a first and a second patterning device, each patterning device being capable of imparting the radiation beam with a pattern in its cross-section to form a patterned radiation beam;
    a substrate table constructed to hold a substrate; and
    a projection system configured to project the patterned radiation beam onto a target portion of the substrate,
    wherein the illumination system comprises a radiation beam path adaptation device configured to adapt a radiation beam path to allow subsequent projections of a pattern of the first patterning device and a pattern of the second patterning device during a single scanning movement of the patterning device support,
    wherein the radiation beam path adaptation device comprises a patterning device masking device configured to, at least in a scanning direction, delimit a beam dimension of the radiation beam, wherein the patterning device masking device is arranged in a focus plane of the illumination system.

2. The lithographic apparatus of claim 1, wherein the radiation beam path adaptation device further comprises
    a radiation beam redirection device movable between at least a first position to direct the radiation beam along a first optical path and a second position to direct the radiation beam along a second optical path.

3. The lithographic apparatus of claim 2, wherein the patterning device masking device is movable in the focus plane in the scanning direction and wherein the first optical path and the second optical path cross the focus plane at different locations, the different locations being spaced apart in the scanning direction.

4. The lithographic apparatus of claim 3, wherein the radiation beam redirection device comprises a set of movable mirrors which in at least one of the first and said second positions redirect the radiation beam along the first optical path or the second optical path, respectively.

5. The lithographic apparatus of claim 2, wherein the first and the second optical path have substantially a same length.

6. The lithographic apparatus of claim 1, wherein
    the illumination system is configured to condition a second radiation beam,
    a first optical path of the radiation beam and a second optical path of the second radiation beam cross the focus plane at different locations, the different locations being spaced apart in the scanning direction,
    the patterning device masking device is configured to, at least in the scanning direction, delimit a beam dimension of the radiation beam and the second radiation beam at the respective different locations, and
    the radiation beam adaptation device comprises a radiation beam redirection device that is movable between at least a first position to direct the first radiation beam along a first optical path and a second position to direct the second radiation beam along a second optical path, the first and second optical paths coinciding between the focus plane and a plane of the first and second patterning devices.

7. The lithographic apparatus of claim 2, wherein the first optical path and second optical paths are mirrored with respect to a main optical axis of the illumination system, the radiation beam redirection device being arranged between the focus plane and a main plane of the first and second patterning device.

8. The lithographic apparatus of claim 7, wherein the redirection device is a multi-mirror device.

9. A lithographic apparatus, comprising:

an illumination system configured to condition a radiation beam; a support constructed to support a first and a second patterning device, each patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the illumination system comprises a radiation beam path adaptation device configured to adapt a radiation beam path to allow subsequent projections of a pattern of the first patterning device and a pattern of the second patterning device during a single scanning movement of the patterning device support, wherein the illumination system comprises a static patterning device masking device configured to define a static projection slit, and a redirection device comprising at least one movable optical element which upon movement is capable of providing a radiation beam making a scanning movement over said projection slit.

10. The lithographic apparatus of claim 9, wherein the at least one optical element is a rotatable cube.

11. The lithographic apparatus of claim 2, wherein the patterning device masking device comprises at least a pair of two masking blades having edges aligned substantially orthogonally with respect to the scanning direction, the masking blades movable in the scanning direction and adapted to delimit the radiation beam dimension in the scanning direction.

12. The lithographic apparatus of claim 10, wherein the at least one optical element comprises two polygon mirrors.

13. A lithographic apparatus comprising:

an illumination system configured to condition a radiation beam;

a support constructed to support a first and a second patterning device, each patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the illumination system comprises a first patterning device masking device configured to, at least in a scanning direction, delimit a beam dimension of the radiation beam, the first patterning device masking device arranged in a first focus plane of the illumination system and movable in the first focus plane in a scanning direction, and a second patterning device masking device configured to, at least in a scanning direction, delimit the beam dimension of the radiation beam, the second patterning device masking device arranged in a second focus plane of the illumination system and movable in the second focus plane in the scanning direction.

14. A device manufacturing method, comprising:

irradiating a first patterning device and a second patterning device with a radiation beam so as to transfer subsequently a pattern from the first patterning device and a pattern from the second patterning device onto a substrate, the first and the second patterning device supported by a single patterning device support that is movable in a scanning direction;

adapting an optical path of the radiation beam so as to subsequently provide a scanning radiation beam for the first patterning device and the second patterning device during a single scanning movement of the patterning device support; and moving in a scanning direction a patterning device masking device arranged in a focus plane of the illumination system and adapted to delimit a radiation beam dimension in the scanning direction.

15. The method of claim 14, wherein the adapting comprises directing the radiation beam along a first optical path to cross the focus plane at a first location to provide a radiation beam for the first patterning device; and subsequently directing the radiation beam along a second optical path to cross the focus plane at a second location spaced apart from the first location in the scanning direction so to provide a radiation beam for the second patterning device.

16. The method of claim 15, wherein directing the radiation beam along the first optical path and/or second optical path comprises using a redirection device comprising a set of movable mirrors which in at least one of a first and a second position redirect the radiation beam along the first optical path or the second optical path, respectively.

17. The method of claim 15, wherein a first radiation source associated with the first optical path and a second radiation source associated with the second optical path are used to provide subsequently a radiation beam at the first and the second location, and wherein a redirection device is arranged to converge the first and second optical paths between the focus plane and a plane of the first and second patterning devices.

18. The method of claim 14, wherein adapting an optical path of the radiation beam comprises directing the radiation beam along the optical path to provide a scanning radiation beam in a first direction on the first patterning device; and subsequently inverting at least part of the optical path of the radiation beam with respect to a main axis of the illumination system with a redirection device arranged between the focus plane and the patterning device support so that a reverse movement of the patterning device masking device results in a scanning radiation beam in the first direction on the second patterning device.

19. A device manufacturing method, comprising:

irradiating a first patterning device and a second patterning device with a radiation beam so as to transfer subsequently a pattern from the first patterning device and a pattern from the second patterning device onto a substrate, the first and the second patterning device supported by a single patterning device support that is movable in a scanning direction; and adapting an optical path of the radiation beam so as to subsequently provide a scanning radiation beam for the first patterning device and the second patterning device during a single scanning movement of the patterning device support, wherein adapting an optical path of the radiation beam comprises providing a static patterning device masking device defining a static projection slit; and providing a redirection device comprising at least one movable optical element, wherein moving the at least one optical element provides a radiation beam making a scanning movement over the projection slit.

20. The method of claim 19, wherein moving of the at least one optical element includes rotating a cubic mirror.

21. A device manufacturing method comprising:

transferring subsequently a pattern from a first patterning device and a pattern from a second patterning device onto a substrate, the first and the second patterning device supported by a single patterning device support that is movable in a scanning direction;

moving a first patterning device masking device in a first focus plane of an illumination system to provide a first scanning radiation beam for the first patterning device; and subsequently moving a second patterning device masking device in a second focus plane of the illumination system to provide a second scanning radiation beam for the second patterning device.

* * * * *